United States Patent
Franklin et al.

(10) Patent No.: US 9,489,254 B1
(45) Date of Patent: Nov. 8, 2016

(54) VERIFICATION OF ERASURE ENCODED FRAGMENTS

(71) Applicant: Amazon Technologies, Inc., Seattle, WA (US)

(72) Inventors: Paul David Franklin, Seattle, WA (US); Jonathan Robert Collins, II, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 102 days.

(21) Appl. No.: 14/500,576

(22) Filed: Sep. 29, 2014

(51) Int. Cl.
*G06F 11/10* (2006.01)
*H03M 13/09* (2006.01)
*H03M 13/29* (2006.01)
*H03M 13/37* (2006.01)
*H03M 13/03* (2006.01)

(52) U.S. Cl.
CPC .......... *G06F 11/1004* (2013.01); *H03M 13/09* (2013.01); *H03M 13/096* (2013.01); *H03M 13/293* (2013.01); *H03M 13/373* (2013.01); *H03M 13/03* (2013.01)

(58) Field of Classification Search
CPC ............. H03M 13/293; H03M 13/09; H03M 13/373; H03M 13/03; G06F 11/1004
USPC .................................. 714/755, 758
See application file for complete search history.

(56) References Cited

U.S. PATENT DOCUMENTS

| | | | |
|---|---|---|---|
| 6,738,380 B1 | 5/2004 | Imai et al. | |
| 7,581,156 B2 | 8/2009 | Manasse | |
| 8,250,433 B2 | 8/2012 | Wylie et al. | |
| 8,418,029 B2 * | 4/2013 | Daikokuya | H03M 13/09 714/763 |
| 8,429,503 B2 | 4/2013 | Okamura et al. | |
| 8,473,778 B2 | 6/2013 | Simitci et al. | |
| 8,504,535 B1 | 8/2013 | He et al. | |
| 8,522,109 B2 | 8/2013 | Murakami et al. | |
| 8,683,296 B2 | 3/2014 | Anderson et al. | |
| 8,706,980 B2 | 4/2014 | Dhuse et al. | |
| 8,751,894 B2 | 6/2014 | Grube et al. | |
| 8,806,296 B1 | 8/2014 | Lazier | |
| 8,850,288 B1 | 9/2014 | Lazier et al. | |
| 8,869,001 B1 | 10/2014 | Lazier | |
| 8,928,503 B2 | 1/2015 | Oggier et al. | |

(Continued)

OTHER PUBLICATIONS

U.S. Appl. No. 14/500,582, filed Sep. 29, 2014, Franklin et al.

(Continued)

*Primary Examiner* — James C Kerveros
(74) *Attorney, Agent, or Firm* — Lee & Hayes, PLLC

(57) ABSTRACT

Erasure encoded fragments may be originally generated by applying an erasure encoding scheme to a data file. An erasure encoded fragment may be subsequently generated directly from previously generated erasure encoded fragments or by reconstructing the original data file and then erasure encoding the reconstructed data file. The integrity or fidelity of such a subsequently generated erasure encoded fragment may be verified by newly generating an error detection code, such as but not limited to a checksum, for the subsequently generated erasure encoded fragment, and comparing that subsequently generated error detection code against an error detection code previously generated for a previous or original version of the erasure encoded fragment. Each error detection code is preferably stored in association with its corresponding erasure encoded fragment and with one or more other erasure encoded fragments. Thus, each error detection code is saved in at least two locations.

20 Claims, 9 Drawing Sheets

(56) References Cited

U.S. PATENT DOCUMENTS

| | | | |
|---|---|---|---|
| 9,026,867 B1* | 5/2015 | Northcott | G06F 11/1048 365/185.09 |
| 9,098,446 B1 | 8/2015 | Donlan et al. | |
| 9,098,447 B1 | 8/2015 | Donlan et al. | |
| 9,158,927 B1 | 10/2015 | Franklin et al. | |
| 9,229,810 B2 | 1/2016 | He et al. | |
| 2004/0078746 A1* | 4/2004 | Tanaka | G11B 20/1833 714/758 |
| 2004/0117718 A1 | 6/2004 | Manasse | |
| 2004/0225946 A1* | 11/2004 | Hashimoto | G06F 11/1008 714/764 |
| 2006/0080574 A1 | 4/2006 | Saito et al. | |
| 2006/0155946 A1 | 7/2006 | Ji | |
| 2006/0184857 A1* | 8/2006 | Takagi | G11B 20/1803 714/758 |
| 2006/0212782 A1 | 9/2006 | Li | |
| 2007/0011582 A1* | 1/2007 | Moriyama | G11B 20/1403 714/768 |
| 2008/0221856 A1 | 9/2008 | Dubnicki et al. | |
| 2009/0222585 A1 | 9/2009 | Khalil et al. | |
| 2010/0083068 A1 | 4/2010 | Wylie et al. | |
| 2010/0094986 A1 | 4/2010 | Zuckerman et al. | |
| 2010/0095012 A1 | 4/2010 | Zuckerman et al. | |
| 2010/0095184 A1 | 4/2010 | Zuckerman et al. | |
| 2010/0100587 A1 | 4/2010 | Teglovic et al. | |
| 2010/0174968 A1* | 7/2010 | Charles | H03M 13/373 714/781 |
| 2011/0029711 A1 | 2/2011 | Dhuse et al. | |
| 2011/0029742 A1 | 2/2011 | Grube et al. | |
| 2011/0029809 A1 | 2/2011 | Dhuse et al. | |
| 2011/0087948 A1 | 4/2011 | Murakami et al. | |
| 2011/0197106 A1* | 8/2011 | Kishigami | H03M 13/09 714/755 |
| 2012/0278679 A1* | 11/2012 | Rub | G11B 20/1833 714/755 |
| 2013/0061116 A1 | 3/2013 | Grube et al. | |
| 2013/0173956 A1 | 7/2013 | Anderson | |
| 2013/0204849 A1 | 8/2013 | Chacko | |
| 2014/0129904 A1* | 5/2014 | Sakai | G06F 11/1012 714/768 |
| 2014/0344531 A1 | 11/2014 | Lazier | |
| 2015/0378820 A1 | 12/2015 | Doerner | |
| 2016/0013815 A1 | 1/2016 | Wideman et al. | |

OTHER PUBLICATIONS

Hendricks, Efficient Byzantine Fault Tolerance for Scalable Storage and Services, Jul. 2009, School of Computer Science Carnegie Mellon University Pittsburgh, PA 15213, pp. v., 1-111.

Luo et al. "An Efficient XOR-Scheduling Algorithm for Erasure Codes Encoding", Publisher: IEEE, published in Dependable Systems & Networks, 2009, IEEE/IFIP Int'l Conference, Lisbon, Jun. 29, 2009-Jul. 2, 2009, pp. 504-513.

Nychis et al., Analysis of Erasure Coding in a Peer to Peer Backup System, May 2006, Carnegie Mellon University, pp. 1-13.

Office action for U.S. Appl. 13/898,071, mailed on Dec. 17, 2014, Donlan et al., "Recover of Corrupted Erasure-Coded Data Files", 10 pages.

Office action for U.S. Appl. 13/898,066, mailed on Dec. 18, 2014, Donlan et al., "Recover of Corrupted Erasure-Coded Data Files", 10 pages.

Office action for U.S. Appl. 13/925,497, mailed on Dec. 19, 2014, Franklin et al., "Cross-Region Recovery of Encrypted, Erasure-Encoded Data ", 14 pages.

U.S. Appl. 13/898,066, filed May 20, 2013, Donlan et al.
U.S. Appl. 13/898,071, filed May 20, 2013, Donlan et al.
U.S. Appl. 13/925,497, filed Jun. 24, 2013, Franklin et al.
U.S. Appl. 14/274,218, filed May 9, 2014, Donlan.
U.S. Appl. 14/307,313, filed Jun. 17, 2014, Donlan.

Huang, C. et al., "Erasure Coding in Windows Azure Storage", Microsoft Corporation [online][retrieved on: May 22, 2013] retrieved from: http://research.microsoft.com/pubs/179583/LRC12-cheng%20webpage.pdf, 12 pps.

Weatherspoon, H. et al., "Erasure Coding vs. Replication: A Quantitative Comparison", Computer Science Division, University of California, Berkeley [online][retrieved on: May 22, 2013] retrieved from: http://www.cs.rice.edu/Conferences/IPTPS02/170.pdf, 6 pps.

Hendricks, J. et al., "Verifying Distributed Erasure-Coded Data", PODS 2007, Aug. 12-15, 2007, Portland, Oregon, US [online][retrieved on: May 22, 2013] retrieved from: http://www.pdl.cmu.edu/PDL-FTP/SelfStar/podc07.pdf, 8 pps.

Office action for U.S. Appl. No. 14/307,313, mailed on Apr. 15, 2016, Donlan et al., "Generation and Verification of Erasure Encoded Fragments", 29 pages.

Office action for U.S. Appl. No. 14/500,582, mailed on Apr. 21, 2016, Frankilin et al., "Verification of Erasure Encoded Fragments ", 21 pages.

Fan, "Network Coding based Information Security in Multi-hop Wireless Networks", Thesis paper presented to the University of Waterloo for fulfillment for the degree of Doctor of Philisopy in Electrical and Computer Engineering, Waterloo, Ontario, Canada, 2010, 110 pages.

Lacan et al., "Systematic MDS Erasure Codes Based on Vandermonde Matrices", IEEE Communications Letters, vol. 8, No. 9, Sep. 2004, pp, 570-572.

Normand et al., "Erasure Coding with the Finite Radon Transform", IEEE Proceedings of the 2010 WCNC, Apr. 2010, 6 pages.

Office action for U.S. Appl. No. 14/274,218 mailed on Feb. 10, 2016, Donlan, "File Recovery Using Diverse Erasure Encoded Fragments", 9 pages.

Phutathum, "Implementing Distributed Storage Systems by Network Coding and Considering Complexity of Decoding", KTH Electrical Engineering Master's Degree Project, Stockholm, Sweden, Aug. 2012, 58 pages.

Sunitha et al., "Ensureing Availability and Integrity of Data Storage in Cloud Computing", Paripex—Indian Journal of Research, vol. 2, Issue 2, Feb. 2013, pp. 119-122.

Tang et al., "A Sub-Matrix Method of Mulitple Reed-Solomon Erasure Coding", AusCTW 2007, Feb. 2007, pp. 166-170.

* cited by examiner

VERIFICATION OF ERASURE ENCODED FRAGMENTS

BACKGROUND

In a data storage system using erasure encoding, an erasure encoding scheme is applied to an original data file to generate a plurality of erasure encoded fragments. The original data file may then be discarded. Subsequently, it may be desirable or necessary to again generate erasure encoded fragments, such as to replace lost or damaged erasure encoded fragments or to add erasure encoded fragments to, for example, increase the likelihood of having sufficient erasure encoded fragments available to permit reconstruction of the original data file.

To subsequently generate erasure encoded fragments if the original data file is no longer available, some of the valid, available, previously-generated erasure encoded fragments are used to rebuild or reconstruct the data file. This reconstructed data file can then be used to generate new erasure encoded fragments. Also, as disclosed below, erasure encoded fragments can be subsequently generated directly from some of the original or previously-generated valid and available erasure encoded fragments, rather than being generated from a data file. Verification of the fidelity of such subsequently generated erasure encoded fragments may, however, be difficult.

It is with respect to these and other considerations that the disclosure presented herein has been made.

DETAILED DESCRIPTION

Figure 1:
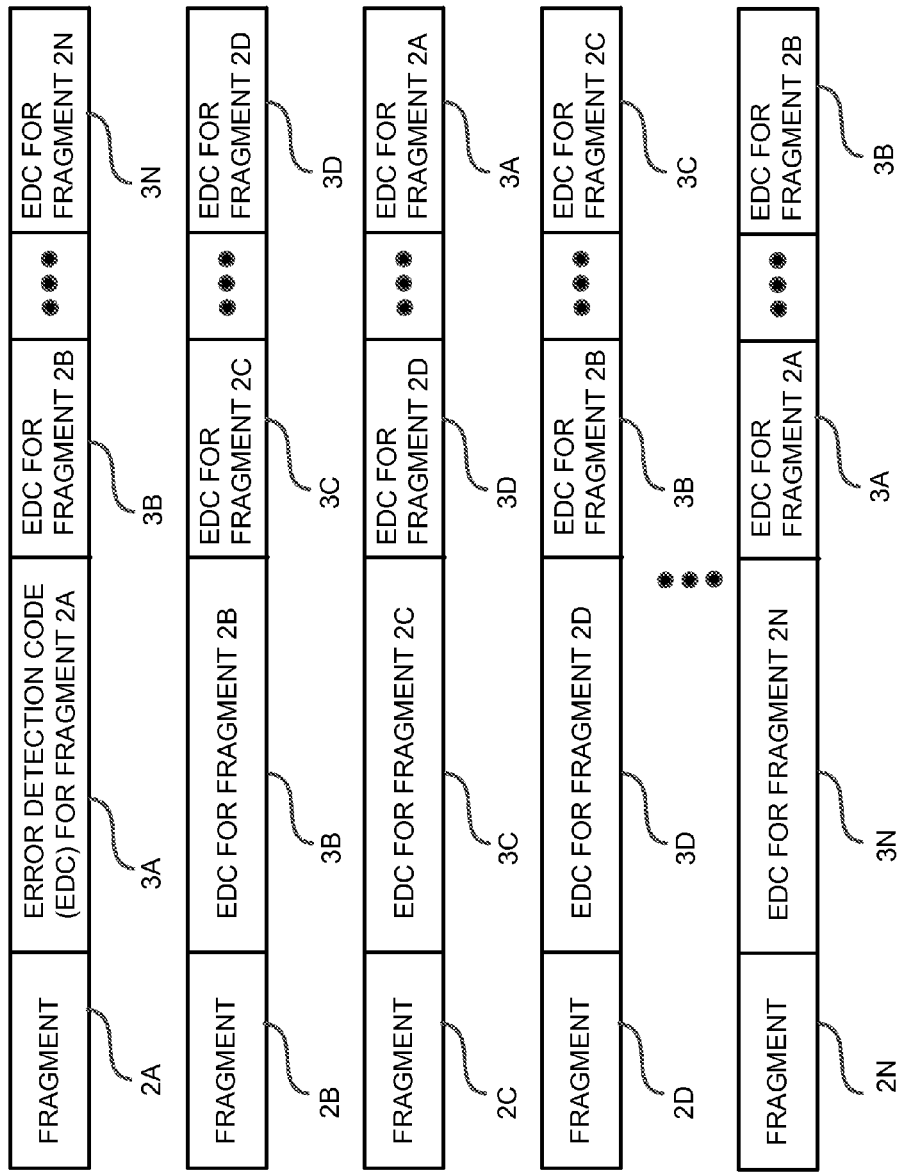
FIG. 1 is an illustration of exemplary erasure encoded fragments with one or more error detection codes.

The following Detailed Description is directed to technology for verification of an erasure encoded fragment, sometimes referred to herein simply as a "fragment". An erasure encoded fragment can be generated from an original data file or a reconstructed data file. An erasure encoded fragment can also be directly generated from other valid and available erasure encoded fragments without first reconstructing the original data file. It is desirable to verify the newly-generated erasure encoded fragment, particularly when it has been generated without first reconstructing the original data file.

Any reference herein to reconstructing, generating, re-generating, or replacing a lost or damaged fragment should be understood to include generating an identical fragment to replace the lost or damaged fragment, generating a non-identical fragment to be used instead of the lost or damaged fragment, and generating a non-identical fragment to increase the number of stored and available erasure encoded fragments. Therefore, a "replacement" version of an erasure encoded fragment may be an identical replacement for an erasure encoded fragment that has become lost or corrupted, may be a non-identical fragment to be used instead of the previous fragment, or may be a non-identical fragment generated so as to increase the number of erasure encoded fragments available to reconstruct the original data file, or for some other reason or purpose.

Prior to a discussion of verification of erasure encoded fragments, it may be useful to discuss how erasure encoded fragments are generated. Generally stated, in an erasure encoding scheme which can be represented as an erasure encoding matrix, the erasure encoded fragments are generated by applying an erasure encoding matrix to the data file and then at least some of the erasure encoded fragments are stored. Erasure encoding generates a mathematical construct of n fragments for an original data file. When reconstruction of the original data file is desired, only m non-identical valid fragments of the n erasure encoded fragments are required to be retrieved to accurately reconstruct the original data file. The fragments may be periodically checked to assure their integrity.

A fragment may be lost or corrupted, however, due to, for example, failure of a disk drive on which the fragment was stored. It may also happen that, for some reason, it is desired to create one or more additional fragments. It may therefore be desirable to re-generate a lost fragment, replace a lost fragment with a different fragment, and/or add one or more different fragments, for example, to ensure that there are always sufficient fragments available to reconstruct the original data file. This can be done by retrieving at least some of the remaining fragments and then reconstructing the original data file. Erasure encoded fragments may then be generated, and used to replace the lost or corrupted erasure encoded fragment, or used instead of the lost or corrupted fragment, and/or stored as new fragments. The process of transferring numerous original fragments can burden a communications network and the process of reconstructing the original data file and generating new erasure encoded fragments therefrom can burden a server. Therefore, a method of generating erasure coded fragments from other erasure encoded fragments without first reconstructing the original data file is also disclosed below.

After an erasure encoded fragment is generated, particularly, but not necessarily limited to, the case where the erasure coded fragment is generated from other erasure encoded fragments without first reconstructing the original data file, it is desirable to verify that erasure encoded fragment. One method of verification of an erasure encoded fragment, regardless of how the erasure encoded fragment was generated, is the use of an error detection code, such as but not limited to a checksum or other error detection or verification code. For example, assume that, as a result of an erasure encoding operation, five erasure encoded fragments are generated. A checksum or other error detection or verification code will then be generated for each erasure encoded fragment. An error detection code for an erasure encoded fragment may be appended to that erasure encoded fragment. This allows for a determination of whether that erasure encoded fragment and the error detection code therefor are in agreement. This process does not, however, indicate which of the erasure encoded fragment or the error detection code has become corrupted, or whether both have become corrupted. Further, if the erasure encoded fragment and the error detection code are both corrupted, or are lost, then they cannot be used to verify the fidelity of a newly-generated fragment.

Therefore, an erasure encoded fragment is preferably associated with its own error detection code and also with error detection codes for one or more other erasure encoded fragments, such as shown in FIG. 1, which is an illustration of exemplary erasure encoded fragments 2A-2N associated with one or more error detection codes (EDC) 3A-3N. For example: an erasure encoded fragment 2A is preferably associated with its own error detection code 3A, and with error detection codes for other erasure encoded fragments, such as represented by error detection code 3B for erasure encoded fragment 2B and error detection code 3N for erasure encoded fragment 2N; an erasure encoded fragment 2B is preferably associated with its own error detection code 3B, and with error detection codes for other erasure encoded fragments, such as represented by error detection codes 3C and 3D for erasure encoded fragments 2C and 2D; an erasure encoded fragment 2C is preferably associated with its own error detection code 3C, and with error detection codes for other erasure encoded fragments, such as represented by error detection codes 3D and 3A for erasure encoded fragments 2D and 2A; an erasure encoded fragment 2D is preferably associated with its own error detection code 3D, and with error detection codes for other erasure encoded fragments, such as represented by error detection codes 3B and 3C for erasure encoded fragments 2B and 2C; and an erasure encoded fragment 2N is associated with its own error detection code 3N, and with error detection codes for other erasure encoded fragments, such as represented by error detection codes 3A and 3B for erasure encoded fragments 2A and 2B. Thus, each error detection code 3A-3N is preferably stored in association with two or more erasure encoded fragments 2A-2N, and each erasure encoded fragment 2A-2N is preferably stored in association with two or more error detection codes 3A-3N.

The error detection code for an erasure encoded fragment is therefore stored in two or more locations and retrieved when needed for verification of a subsequently-generated erasure encoded fragment. The error detection code can therefore be used to verify the fidelity of the subsequently-generated erasure encoded fragment even if the originally-generated erasure encoded fragment and its original error detection code were in the same file and were both lost or corrupted.

For example, assume that, from a data file F, five fragments, 2A-2D and 2N are generated. Error detection codes, such as but not limited to, checksums 3A-3N will also be generated for some or all of these fragments. Fragment 2A will then be stored, along with possibly its own checksum, 3A, and the checksum of at least one other fragment, such as checksums 3B and 3N. Now assume that fragment 2B has been determined to be corrupted, or maybe it is desired to newly generate fragment $2B_{NEW}$ for some other reason. Also assume, for simplicity of example, that fragment $2B_{NEW}$ can be directly generated from fragments 2A and 2D, that such generation is performed, and that a new checksum $3B_{NEW}$ is generated from the newly-generated fragment $2B_{NEW}$. It is then desirable to verify the fidelity of the newly-generated erasure encoded fragment $2B_{NEW}$ and its newly-generated checksum $3B_{NEW}$. Note that the original checksum 3B for erasure encoded fragment 2B was stored with one of the other erasure encoded fragments 2A, 2C, 2D, or 2N, and can therefore be retrieved.

Assume, by way of example and not of limitation, that the original checksum 3B for erasure encoded fragment 2B was stored in association with erasure encoded fragment 2D. That original checksum 3B stored in association with erasure encoded fragment 2D will be recalled. A comparison may then be made between the original checksum 3B and the newly-generated checksum $3B_{NEW}$. If these checksums match then the newly-generated erasure encoded fragment $2B_{NEW}$ is valid. If these checksums do not match then other action may be taken, as discussed below. This process can also be used, if desired, to determine the fidelity of newly-generated fragments which are generated from the data file F, such as when the data file F is reconstructed or restored from available fragments and new fragments are generated from that reconstructed data file F.

One or more error detection codes and an erasure encoded fragment may be associated by appending the error detection code(s) to the erasure encoded fragment and storing the result as a single file, or the error detection code(s) and the erasure encoded fragment may be stored as multiple separate files, with a table, pointer, or other link, indicating that the error detection code is associated with, or applies to, that particular fragment. For example, the erasure encoded fragment 2A and its associated error detection codes 3A, 3B, . . . 3N, may be stored as a single file. A table, pointer, or other link may then indicate that erasure encoded fragment 2A and its own error detection code 3A are stored at memory location 1, and that its error detection code is also stored at location 2 in association with fragment 2C, and also stored at location 3 in association with fragment 2N. Similarly, a table, pointer, or other link may then indicate that erasure encoded fragment 2B and its own error detection code are stored at location 4, and that the error detection code 3B for erasure encoded fragment 2B is also stored at location 1 in association with fragment 2A, and also stored at location 3 in association with fragment 2N.

As another example, the erasure encoded fragment 2A may be stored as one file, its associated error detection code 3A stored as another file, its associated error detection code 3B stored as another file, . . . and its associated error detection code 3N stored as another file, with pointers or links referencing the various erasure encoded fragments and their plurality of error detection codes. Note that, preferably, duplicate error correction codes are separately stored, rather than being stored as a single error correction code. For example, error correction code 3B would preferably be stored in one location in association with erasure encoded fragment 2A, be stored in another location in association with erasure encoded fragment 2B, and be stored in yet another, third location in association with erasure encoded fragment 2N.

A table, pointer, or other link may then indicate that erasure encoded fragment 2A is stored at memory location 1, and its own error detection code 3A is stored at location 2, and that its error detection code 3A is also stored at locations 3 and 4 in association with, but not as part of, fragments 2C and fragment 2N. Similarly, a table, pointer, or other link may then indicate that erasure encoded fragment 2B, stored at location 5, is associated with its own error detection code 3B stored at location 6, and also associated with error detection codes 3C and 3D, stored at locations 7 and 8.

Thus, the error detection code for an erasure encoded fragment is stored at multiple locations so that, even it becomes lost from or corrupted in one location, e.g., the location associated with erasure encoded fragment 2B, it will be available from at least one other location, such as the location associated with erasure encoded fragment 2A and/ or 2N.

Figure 2:
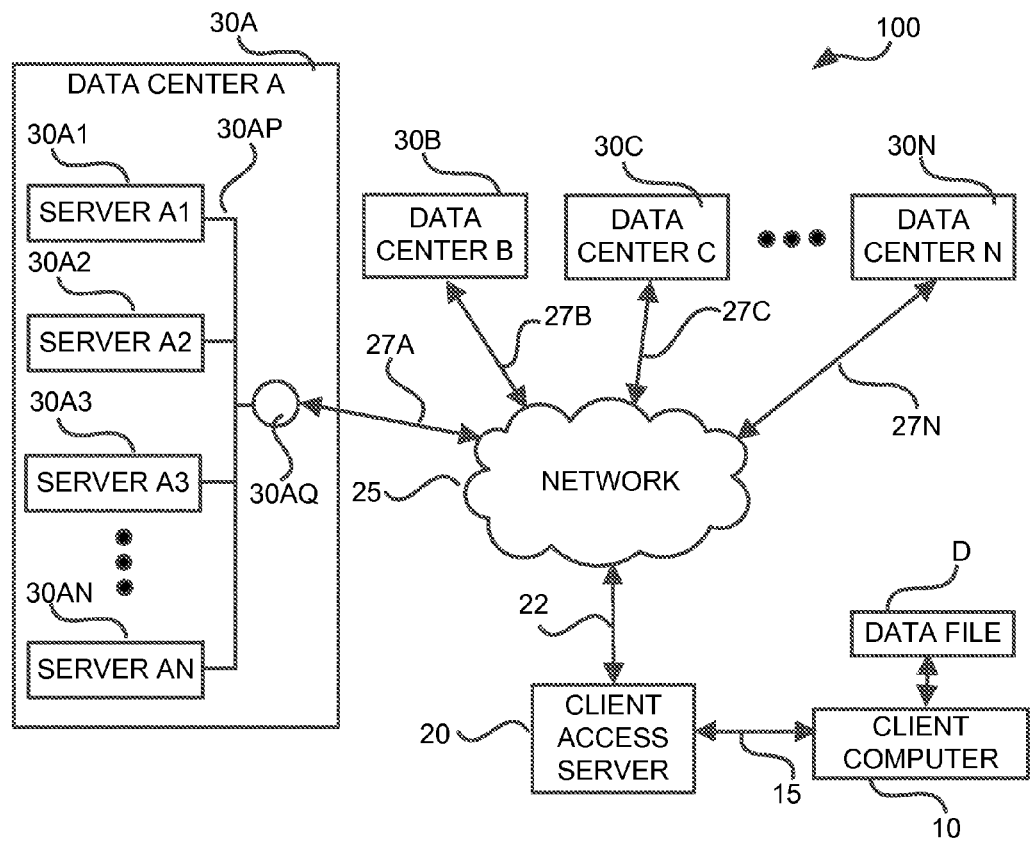
FIG. 2 is an illustration of an exemplary distributed computing system to receive, erasure encode, store, recover, decode/reconstruct, verify, and send information such as files, erasure encoded fragments, error detection codes, and/or data.

FIG. 2 is an illustration of an exemplary distributed computing system 100 that can receive an original data file, erasure encode the original data file, store the erasure encoded fragments, retrieve the erasure encoded fragments, decode/reconstruct the data file from erasure-encoded fragments, generate erasure encoded fragments without first reconstructing the original data file, send a reconstructed data file, and verify erasure encoded fragments, regardless of whether the original data file is first reconstructed, or whether the erasure encoded fragment is generated directly from other erasure encoded fragments. A typical system 100 may include, by way of example and not of limitation, a client access server 20, a network 25, and a plurality of data centers 30A-30N.

In the example system 100 shown in FIG. 2, a client has a data file D that the client wishes to have backed up at a location other than at the client site. In order to accomplish this, a client computer 10 connects with a client access server 20, client access gateway, or client access portal via a connection 15, and sends the data file D to the client access server 20. Typically, a client might send multiple data files to the client access server 20 for storage. The connection 15 may be any desired connection or connections that provide the desired security, data speed, cost of service, etc., such as, but not limited to, the Internet.

In response to receiving a data file D, the client access server 20 erasure encodes the data file using, for example, an m-of-n system, such as Reed-Solomon or other deterministic maximum-distance-separable erasure code, and distributes at least m of the n fragments over a connection 22 and a network 25 to a multitude of data centers 30A-30N for storage (collectively the data centers 30, or individually a data center 30, as the context may require). The network 25 is preferably a secure, internal data network but can be the Internet or any desired connection or connections that provide the desired security, data speed, cost of service, etc. The connection 15 and the network 25 may be the same or may share one or more connections. Each data center 30A-30N is connected to the network 25 by a respective connection 27A-27N.

There could be only two data centers 30 with each data center storing m of the n fragments, n data centers with each data center storing one of the n fragments, more than n data centers with some of the fragments being duplicated across two or more data centers, or even k data centers with each data center storing n/k fragments, where n/k is not less than n-m. Each data center 30 preferably has one or more data servers, sometimes conventionally referred to as "nodes". For example, data center 30A may have a plurality of data servers A1-AN (30A1-30AN). These data servers 30A1-30AN are connected by a data center internal network 30AP to a data center local network hub 30AQ, which is connected to the network 25. Thus, the n fragments may be distributed across one or more data servers in one or more data centers.

Suppose now that the client computer 10 suffers a hard drive failure, from which the data file cannot be recovered, or suffers from some other event that destroys the data file on the client computer 10. The client will then use a client computer 10 (or even a new or replacement computer) to request that the client access server 20 retrieve and provide those stored data files to the client computer 10. For each data file, the client access server 20 will then request that the various data centers 30 reconstruct the data file(s) and provide the data file(s) to the client access server 20, or provide the erasure encoded fragments for the data file(s) to the client access server 20, in which case the client access server 20 may then use the fragments to reconstruct the data file(s). The client access server 20 will then send the reconstructed data file(s) to the client computer 10. Data file reconstruction may be performed by the client access server 20, by any one or more of the servers in the data centers 30A-30N, by the client computer 10, or by another computing device or devices.

During the process of reconstruction of the data file, or during a random check, periodic check, scheduled check, etc., of the data stored on a data server in a data center, it may be found that one or more fragments have become lost or corrupted due to, by way of example, a disk drive failure or error of some sort. When that occurs, it is desirable to recreate and replace the lost or corrupted fragment to ensure that, should another fragment or fragments become corrupted, there are still enough valid fragments to reconstruct the data file D.

A lost or damaged fragment need not be replaced with an identical fragment. For example, if originally-generated fragment "X" is damaged, it does not have to be replaced by a newly-generated fragment "X" which is identical to the originally-generated fragment "X". Instead, a new fragment "Y" may be generated and stored in the place of the lost or damaged fragment "X", and then links or references to fragment "X" are removed or deleted.

Also completely new fragments may be generated for other reasons. For example, it may be found that the original fragment storage scheme only stored m+10 of the fragments and it is now desired, for higher reliability, to store m+20 fragments. The additional fragments may be newly generated and stored directly from the available erasure encoded fragments without first reconstructing the data file.

Assume, for example, that there are several fragments in the data servers 30A1-30AN, and several fragments in the data servers in each of the data centers 30B-30N. Also assume that the client access server 20 is responsible for generating the replacement fragment (that assumption is for convenience of discussion as any data server in any data center could have that responsibility). Each of data servers 30A1-30AN will send fragments via the data center connection 27A and network 25 to the client access server 20. Data servers (not shown) in the other data centers will similarly send fragments via their respective connections 27B-27N and the network 25 to the client access server 20. Thus, the connections 22 and 27A-27N and the network 25 are then handling their normal traffic as well as the additional traffic caused by the transfer of multiple fragments from one server to another so that a lost or corrupted fragment can be replaced. Consequently, the connections 22 and 27A-27N and the network 25 may become "choke points" or "bottlenecks" for network traffic. This can delay replacement of the missing or corrupt file as well as delay the servicing needs of other clients of the system 100. Further, the tasks of reconstructing the original data file from the collected fragments and then generating new fragments can place an additional computational burden on an already-busy server.

Figure 3:
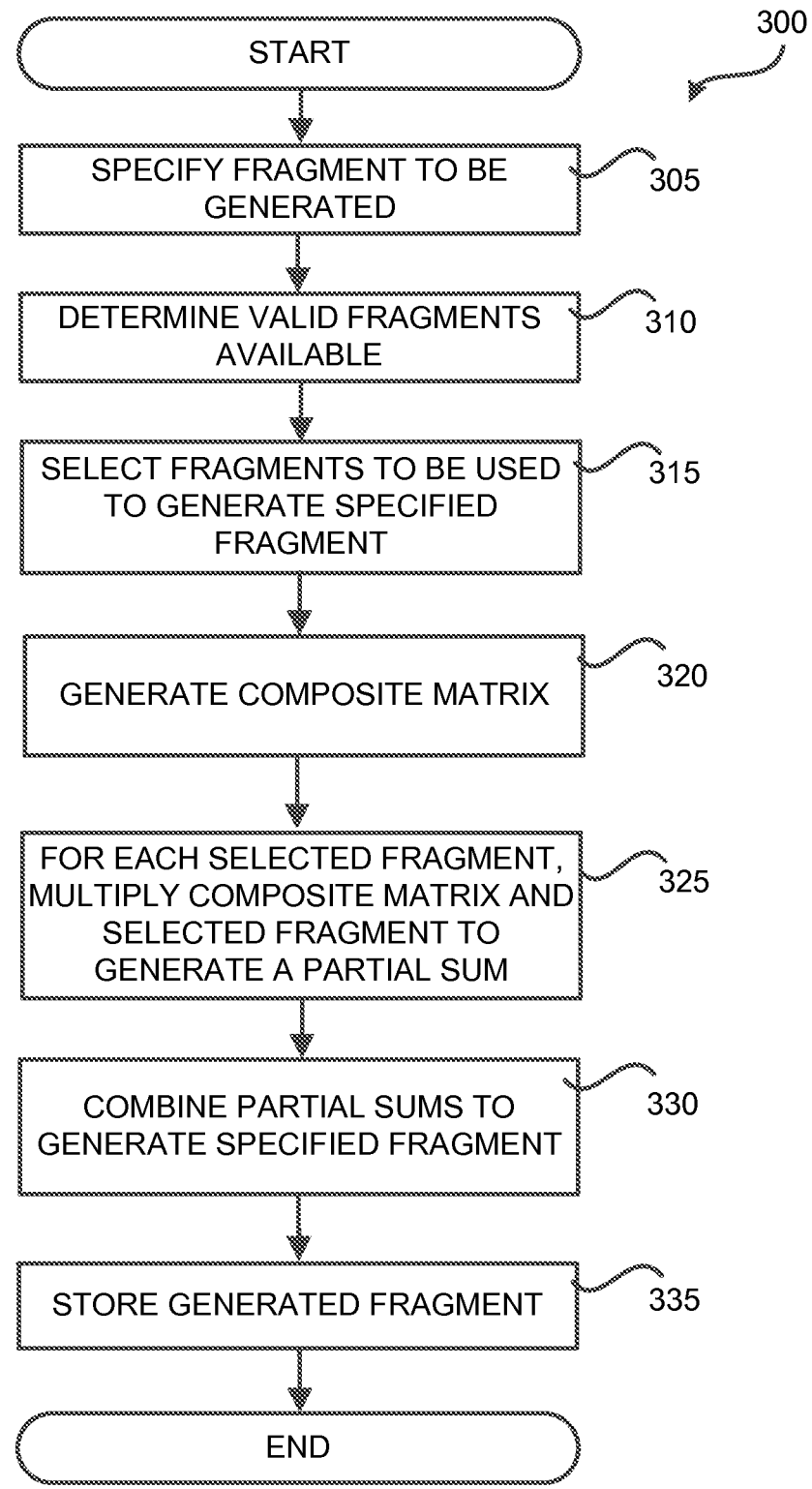
FIG. 3 is a flow diagram showing a general illustrative routine for generating a new erasure encoded fragment directly from other erasure encoded fragments.

FIG. 3 is a flow diagram showing a general illustrative routine 300 for generating a new erasure encoded fragment directly from other erasure encoded fragments. As disclosed herein, a fragment can be generated from other fragments related to an erasure encoding scheme and a data file without recourse to the original data file or a reconstruction of that data file. The term "related to" indicates that fragments may have been previously generated by applying the erasure encoding scheme to the data file, previously generated directly from other previously-generated fragments, and/or generated by some other technique. For example, some of the fragments to be used may have been generated by applying the erasure encoding scheme to an original or reconstructed data file, and others of the fragments to be used may have been generated directly from other fragments. Further, the computational workload may be distributed among and performed by one or more servers.

In the routine 300, the fragment to be generated is specified at operation 305 based upon, for example but not limited to, any of the considerations discussed above. The valid fragments available from the one or more servers are then determined at operation 310. The fragments which are to be used to generate the specified fragment are selected at operation 315, that is, of the previously-generated available and valid fragments, the fragments to be used to generate the new fragment are selected.

A composite matrix is generated at operation 320 based upon the erasure encoding scheme, the selected fragments, and the specified fragment. The composite matrix may be generated by one server and sent to other servers, or each server may be responsible for generating its own composite matrix. Each server generating a composite matrix uses the same information: (a) an identification of the fragments which will be used to generate the new fragment, this is used to generate a collect-fragment specific matrix which will then be inverted, this matrix is one that would be used if it were desired to generate only those particular fragments directly from the original or reconstructed data file; (b) an identification of the fragment to be generated, this is used to generate the desired-fragment specific matrix, this matrix is one that would be used if it were desired to generate the specified new fragment directly from the original or reconstructed data file, this matrix will then be multiplied with the inverted matrix to produce the composite matrix; and (c) an identification of which fragments the server should use to generate a partial sum, this is used to generate a collected fragment matrix, which will then be multiplied with the composite matrix to produce the partial sum for that server.

For each selected fragment, the composite matrix and the selected fragment are multiplied at operation 325 to produce a partial sum, the plurality of selected fragments thereby producing a plurality of partial sums. The partial sums may be generated by multiple servers or may be generated by a single server. One or more of these partial sums may be sent to any available server for the next operation. These partial sums are then combined at operation 330, such as by adding, to generate the specified fragment. The generated specified fragment is then stored at operation 335. The generated fragment may be stored at the server which generated the fragment, and/or may be sent to one or more other servers for storage.

Two or more of these partial sums may be combined to produce a first intermediate sum, which may be sent to an available server for the next operation, which may combine this first intermediate sum with other partial sums or other intermediate sums to produce a second intermediate sum, which may be sent to an available server for the next operation, which may combine this second intermediate sum with other partial sums or other intermediate sums to produce a third intermediate sum, and so on. Once all of the partial sums and any intermediate sums have been combined, then the generated result is the specified fragment. Also, two or more of these partial sums may be combined to produce a first intermediate sum, and a different two or more of these partial sums may be combined to produce a second intermediate sum, and so on. Once all of the partial sums and any intermediate sums have been combined, then the generated result is the specified fragment. Thus, the partial sums may be combined in one operation or even in multiple tiers of operations to generate the specified fragment.

In addition, a server may, instead of performing partial sums on the fragment or fragments that it has, may simply send that fragment or those fragments to another server, which can generate the partial sums for those fragments and combine those partial sums with partial sums that it has generated from its own fragments, with partial sums that it has received from other servers, and/or with partial sums that it has received from other data centers. The resulting sum may be a partial sum which is then provided to another server, or may be the specified fragment if there are no other partial sums to be used.

The new fragment has therefore been generated without first reconstructing the original data file D. Each server may be tasked with producing only one partial sum, thereby distributing the computational workload. Any desired and available server may be tasked with combining the partial sums, such as by adding them. It should be noted that the results of several selected fragments may be included in a single partial sum. For example, if a server has five fragments, it will still, preferably although not necessarily, produce only a single partial sum representing the results of all five of those fragments. The various options discussed herein therefore reduce network traffic and/or reduce or redistribute the computational workload among the various servers.

Operations may be performed on the fragments located at a particular data server or data center to generate a partial sum, and the partial sum(s) resulting from such processing may be sent to another data server or data center for further processing. For example, rather than sending recovered fragments $F_a$, $F_b$, and $F_c$ individually across the network, only the resulting partial sum $(A_aF_a+A_bF_b+A_cF_c)$ is sent across the network. Likewise, rather than sending recovered fragments $F_e$ ... $F_a$ individually across the network, only the resulting sum $(A_eF_e+ \ldots A_nF_n)$ is sent across the network. The actual network traffic savings will depend on the number of fragments actually located in a data server or data center, and which server is the recipient of the processed fragments.

Figure 4A:
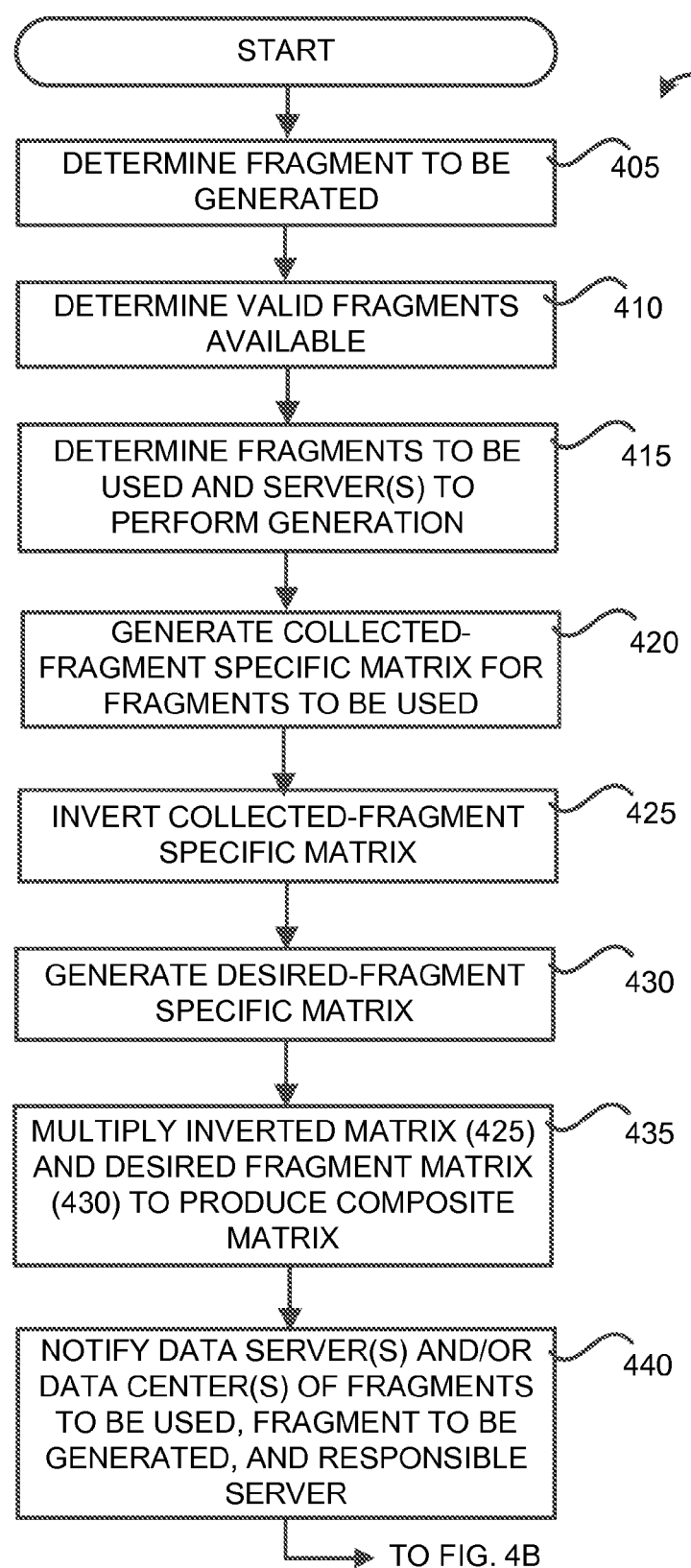
FIGS. 4A and 4B are flow diagrams showing a more specific illustrative routine for generating a new erasure encoded fragment.
Figure 4B:
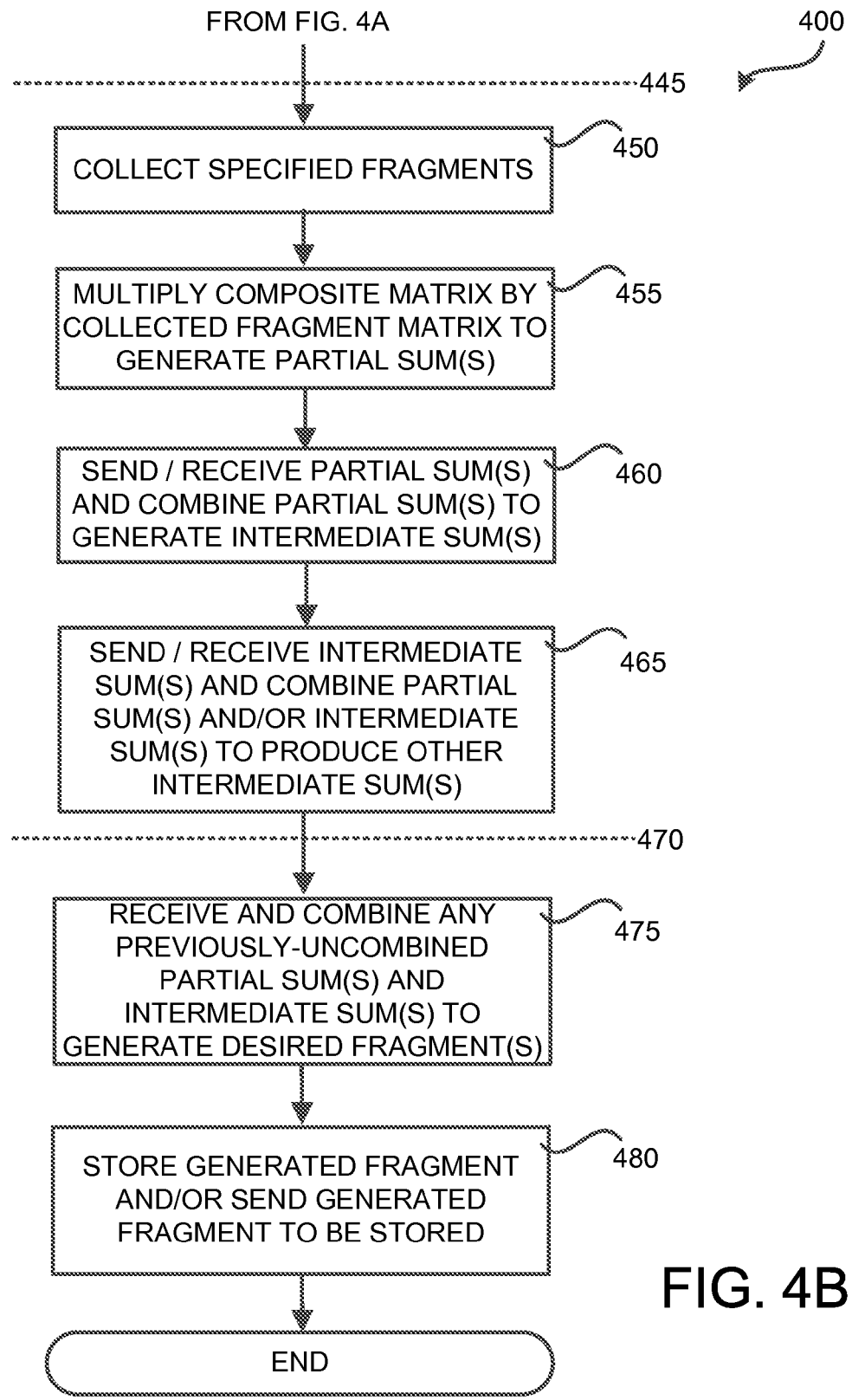

FIGS. 4A and 4B are flow diagrams showing a more specific illustrative routine 400 performed by a system 100 or components thereof, such as a client access server 20, a server 30A1-30AN in a data center 30A-30N, other computing device, or combination thereof, to generate an erasure encoded fragment without first reconstructing the original data file. For convenience of discussion, the device(s) performing the operation will be referred to as a server, such as a data server, a client access server, or some other computing device. Also, for convenience of discussion, a "lead" server may perform certain operations, and designate other servers to perform other operations. The designation of which server performs which operations may be changed as desired for a particular operating environment, such as for, but not limited to, the reasons discussed herein.

The routine 400 begins at operation 405, where a server detects a lost or damaged fragment, or a determination is made, possibly in response to a new system policy or possibly even by a human operator, that it is desired to have one or more additional fragments stored. As noted, this may be discovered during a check of file integrity or during an attempt to reconstruct a data file. A lead server such as, for example, server 30A1 in data center 30A, then determines, at operation 410, which fragments for the relevant data file are valid and available. This may be done by requesting the other servers to identify which fragments they have that are available and valid.

At operation 415 the lead server determines which of those fragments are to be used to generate the new fragment, and which remote server(s) is(are) to generate the new fragment. Determining which fragments are to be used, and which server(s) is(are) to generate the new fragment, may be based, for example, on the factors and considerations discussed herein. In operation 420 the lead server then generates the collected-fragment specific matrix for the fragments specified to be used to generate the new fragment. This collected-fragment specific matrix may be, for example, an encoding matrix that would be used to operate on a data file if it were desired to produce only those fragments from the data file. Then, at operation 425, the collected-fragment specific matrix is inverted.

In operation 430 the server generates the desired-fragment specific matrix. This desired-fragment specific matrix is an encoding matrix that would be used to operate on a data file if it were desired to produce only the new (desired) fragment (s) from the data file. At operation 435, the lead server multiplies the inverted matrix of operation 425 with the desired fragment matrix of operation 430 to produce a composite matrix. At operation 440, the lead server sends the composite matrix to the other data server(s) and/or data centers, and notifies the other data server(s) and/or data center(s) of the new fragment to be generated, and the fragment(s) to be used in the generation of a partial sum by that server. Dashed line 445 is used at FIG. 4B to indicate that one or more different servers or devices may be performing operations 450-465.

In operation 450 each designated server will collect the fragments specified to be used by it and generate a collected fragment matrix. In some cases, where a server is only designated to process one fragment, the collected fragment matrix may be a 1-by-1 matrix. If the lead server generated the composite matrix based upon all of the designated fragments then a server receiving the composite matrix from the lead server will reduce the size of the received composite matrix by removing rows from the matrix to generate a reduced composite matrix that only contains the matrix rows related to the designated fragments to be used by that particular server. For example, if the composite matrix was for fragments $F_a$, $F_b$, $F_c$, but the server was only tasked to perform operations using fragments $F_a$ and $F_c$, it would remove the row which would generate fragment $F_b$. Alternatively, zeroes may be inserted into the collected fragment matrix for the fragments which are not being used by that server, such as fragment $F_b$. At operation 455 each designated server will generate a partial sum by multiplying the (reduced) composite matrix by its collected fragment matrix. If multiple desired fragments are being generated, then operations 450-460 may be performed for each desired fragment.

At operation 460, a server may send its generated partial sum(s) to another server, and/or receive partial sums from other server(s). It may then combine partial sums to generate intermediate sums. The routine 400 then proceeds to operation 465, where a server may send the intermediate sum(s) it has generated, receive intermediate sum(s) from other servers, combine partial sum(s) and/or intermediate sum(s) to produce other intermediate sum(s). Operation 465 may be repeated several times to create a tiered mode of operation such that one or more servers forward their partial and/or intermediate sum results to another server, which combines their results with any partial sums it has received or generated to produce another intermediate sum, forward that intermediate sum to a server which combines partial sums from other servers, intermediate sums from other servers, and/or with any partial sums it has generated to produce another intermediate sum, and so on.

Dashed line 470 is used to indicate that a different server or device, such as the lead server, may be performing the next set of operations. The lead server may also perform one or more of operations 450-465. At operation 475 the lead server, or other designated server, will receive any previously-uncombined partial sum(s) and/or intermediate sum(s) from the various other servers. This server will combine these partial sum(s) and/or intermediate sum(s) to generate the new fragment(s). Finally, at operation 480 the server will store the new fragment and/or send the new fragment to another server or data center for storage.

In another configuration, the lead server does not send the entire composite matrix to each of the servers designated to generate a partial sum. Rather, the lead server will generate one or more server-specific composite matrices by removing columns from the matrix to generate a reduced composite matrix that only contains the matrix columns related to the designated fragments to be used by a particular server. The lead server will then send a server-specific (reduced) composite matrix to each particular server. Each receiving server may then multiply that received, server-specific composite matrix with the collected fragment matrix of that server to generate a partial sum.

In another configuration, the lead server does not generate a composite matrix or server-specific composite matrices. Rather, after determining at operation 415 the fragments to be used and the server(s) to generate the new fragment, the lead server then notifies the other data servers and/or the data centers as to the fragments to be used to generate the collected-fragment specific matrix, which fragment(s) are to be used by that particular data server or data center, which fragment is to be generated and, if generation is to be performed by a server other than the lead server, specify the server to which the partial sums should be sent. It will be recalled, as discussed above, that it may neither be necessary nor desirable to use every fragment locally available to a server. For example, if two servers have fragment $F_c$, for example, only one of them should perform the operations with respect to that fragment.

The task of combining sums is an associative process. Thus, for example, partial sums A, B and C may be combined as A+B+C, A+(B+C), (A+B)+C, B+(A+C), B+C+ A, etc. Accordingly, the task of combining partial sums may be performed by a single server, or may be performed by multiple servers and in multiple tiers. For example, server 30A1 may send its partial sum to server 30A2. Server 30A2 may then combine its own partial sum and/or a partial sum from another server or another data center with the partial sum from server 30A1 to generate a first combined sum.

Server 30A2 may then send that first combined sum to server 30A3. Server 30A3 may then combine its own partial sum and/or a partial sum or combined sum from another server or another data center with the first combined sum from server 30A2 to generate a second combined sum. Server 30A3 may then send that second combined sum to another server, such as server 30AN, etc. Server 30AN may then combine its own partial sum and/or a partial sum or combined sum from another server or another data center with the second combined sum from server 30A3 to generate a complete sum, that is, to generate the desired fragment. Thus, the task of combining partial sums to generate the desired fragment may be spread across servers in a data center, and across data centers in geographically-distant locations.

The process described above may be expanded to generate multiple fragments at once rather than generating each new fragment individually. This can be accomplished by generating a composite matrix with additional rows for the additional desired fragments. However, the size of the data to be transferred, that is, the partial sums, grows proportionally to the number of new fragments to be generated. As a result, at some point the network traffic may increase, rather than decrease, and might eventually involve more network traffic and processing power than simply reconstructing the entire data file. Therefore, consideration is preferably given to whether it is more efficient to generate a new fragment or fragments directly from the available fragments or whether it is more efficient to perform a standard data file reconstruction and then generate the desired fragments from the reconstructed data file.

Also, even though reduction of network traffic may be a benefit of using the process described above, the process may also be performed by a single device which has m valid fragments. The single device can identify the fragments to be used, generate the composite matrix, and multiply the composite matrix by the identified fragments to produce partial sums, and sum those partial sums to generate the new fragment.

After generation of a fragment it may be desirable to verify that fragment. With traditional reconstruction techniques, wherein the complete data file is reconstructed and then the reconstructed data file is erasure-encoded again, an integrity check can be easily performed using a checksum of the reconstructed data file. The encoding host produces the new fragment from the reconstructed data file and then attempts to reconstruct the data file again using that new fragment in place of one of the other fragments. It then compares the checksums of the two reconstructed data files. If they do not match, then an error has occurred.

The traditional reconstruction technique described above, however, may unacceptably increase the network traffic. The traditional checksum procedure might also be undesirable for use with the fragment generation process disclosed herein because the complete original data file is not first reconstructed in order to generate a new fragment.

The main types of errors that may occur when attempting generation of a new fragment or reconstruction of a complete data file are: processor (computational) errors; corrupt partial sums (server specific results); and corrupt input fragments. Computational errors can be detected by performing the same computation two or more times on the same server, on two different servers, or at two different data centers, and comparing the results of the computations. Corrupt partial sums can be detected in the same manner as for computational errors, that is, generating a partial sum more than once and comparing them. A corrupted input fragment is ideally detected by performing a checksum, but if an input fragment is corrupt then the newly-generated fragment will be corrupt as well so the newly-generated fragment will have to be verified by another technique, such as the technique disclosed below.

Figure 5:
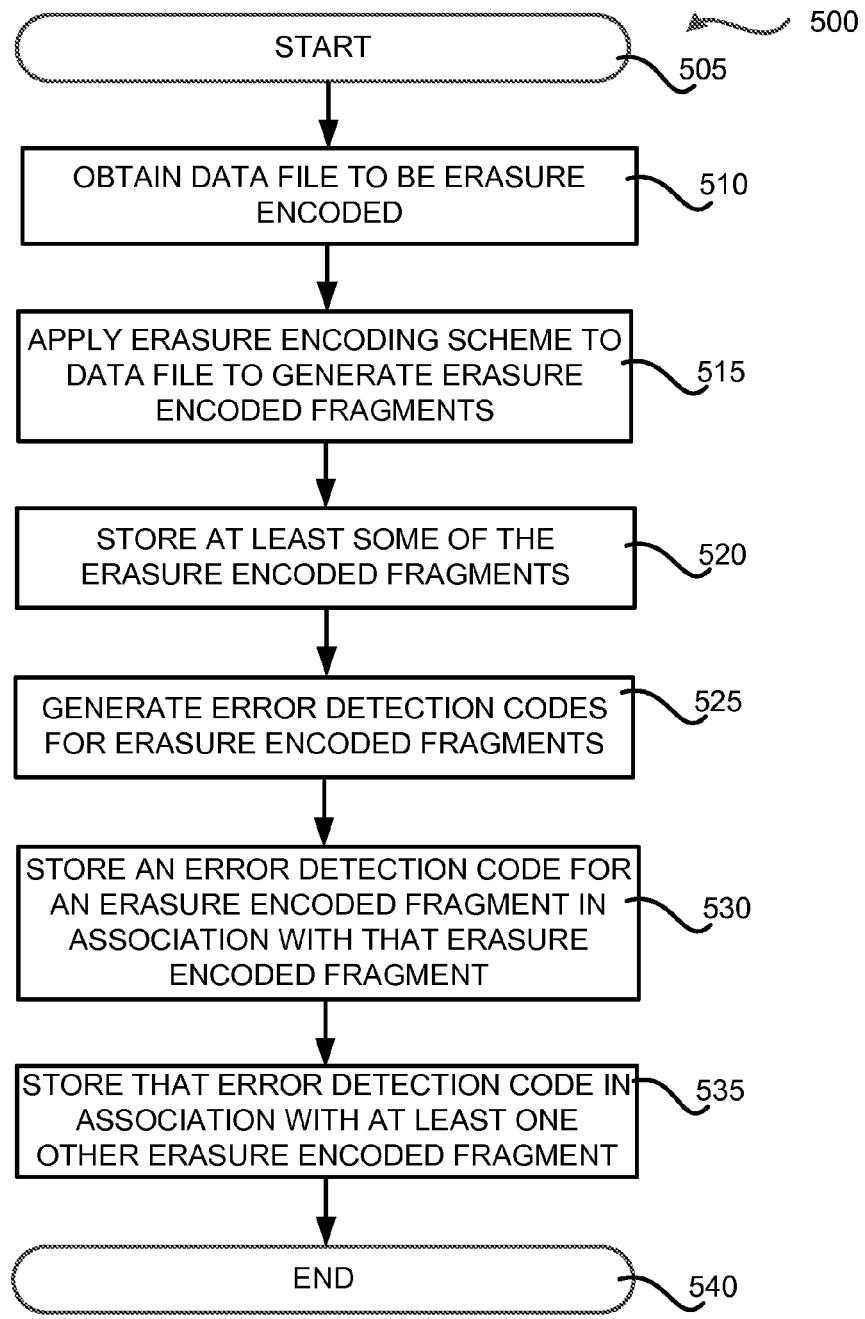
FIG. 5 is a flow diagram showing an illustrative routine for generating and storing erasure encoded fragments and associated error detection codes.

FIG. 5 is a flow diagram showing an illustrative routine 500 for generating and storing erasure encoded fragments and associated error detection codes. System operations are performed by one or more servers such as but not limited to server 30A1-30AN and/or the client access server 20.

The process 500 begins at operation 505. At operation 510 the system 100 obtains a data file which is to be erasure encoded. The system may obtain a data file by receiving, retrieving, or generating the data file. At operation 515 the system applies the desired erasure encoding scheme to the data file to generate a plurality of erasure encoded fragments. It is preferable, but not necessary, that a full set of erasure encoded fragments be generated. For example, an erasure encoding scheme, if applied to a data file, might be able to generate 256 erasure encoded fragments. Instead, however, only a limited number of erasure encoded fragments might be generated or stored, for example, 15 erasure encoded fragments of the 256 possible fragments might be generated and stored, even if a lesser number, for example, only 6, 7, or 8, of them are necessary to reconstruct the data file. At operation 520, at least some of the erasure encoded fragments are stored.

At operation 525, error detection codes are generated for the erasure encoded fragments. In one example, the maximum number of erasure encoded fragments is generated and an error detection code is generated for each fragment. In another example, a lesser number of fragments are generated and stored, for example, 15 fragments, and so 15 corresponding error detection codes are generated and stored. The error detection code may be generated by any desired technique which provides an indication as to whether the erasure encoded fragment has been corrupted. One example of an error detection code is a checksum. At operation 530, the error detection code for an erasure encoded fragment is stored in association with that fragment.

At operation 535, that error detection code is also stored in association with at least one other erasure encoded fragment. Alternatively, at least one other error detection code is also stored in association with that erasure encoded fragment, the at least one other error detection code being for a different erasure encoded fragment. That is, an error detection code may be appended to an erasure encoded fragment and stored with it as a single file, or an error detection code and the erasure encoded fragment may be stored as two separate files, with a table, pointer, or other link indicating that the error detection code is associated with that erasure encoded fragment, but applies to another erasure encoded fragment. The process may then end 540.

Preferably, each error detection code is thereby stored in association with two or more erasure encoded fragments. Alternatively, or in effect, two or more error detection codes are stored in association with each erasure encoded fragment, one of the other error detection codes being for another erasure encoded fragment. For example, if the erasure encoded fragment is an even-numbered erasure encoded fragment, then the error detection codes for one or more of the odd-numbered erasure encoded fragments may be stored in association with that even-numbered erasure encoded fragment. If the erasure encoded fragment is an odd-numbered erasure encoded fragment, then the error detection codes for one or more of the even-numbered erasure encoded fragments may be stored in association with that odd-numbered erasure encoded fragment. Although this even-odd crossover approach is preferred, other approaches may be used. For example, if the erasure encoded fragment is an even-numbered erasure encoded fragment, then the error detection codes for one or more of the other even-numbered erasure encoded fragments may be stored in association with that even-numbered erasure encoded fragment or, if the erasure encoded fragment is an odd-numbered erasure encoded fragment, then the error detection codes for one or more of the other odd-numbered erasure encoded fragments may be stored in association with that odd-numbered erasure encoded fragment.

As another example, for an erasure encoded fragment numbered X, the error detection codes for erasure encoded fragments X−4, X−3, X−2, X−1, X+1, X+2, X+3, and X+4 may be stored in association with that erasure encoded fragment. As yet another example, the error detection codes for all erasure encoded fragments may be stored in association with each erasure encoded fragment. Other association schemes may also be used. There is a header, table, link, or other indicator for each error detection code which indicates the fragment number from which it was generated. Also, the erasure encoded fragments and associated error detection codes may be, and preferably are, distributed and stored across a plurality of storage devices and/or server systems.

Even more preferably, each error detection code is stored in multiple locations, such as in association with two or more erasure encoded fragments. For example, if the error detection code is for an even-numbered erasure encoded fragment then that error detection code may be stored in association with one or more odd-numbered erasure encoded fragments. If the error detection code is for an odd-numbered erasure encoded fragment then that error detection code may be stored in association with one or more even-numbered erasure encoded fragments. Again, an even-odd crossover approach is preferred although other approaches may be used.

As another example, the erasure encoded fragments may be stored in groups. For example, Group I may have erasure encoded fragments 1-5, Group II may have erasure encoded fragments 6-10, Group III may have erasure encoded fragments 11-15, etc., or some other grouping other than groups of five. Each error detection code would then preferably be stored in association with two or more groups of erasure encoded fragments. Storing an error detection code in association with a group of erasure encoded fragments is considered to be storing the error detection code in association with at least one erasure encoded fragment in that group.

Figure 6A:
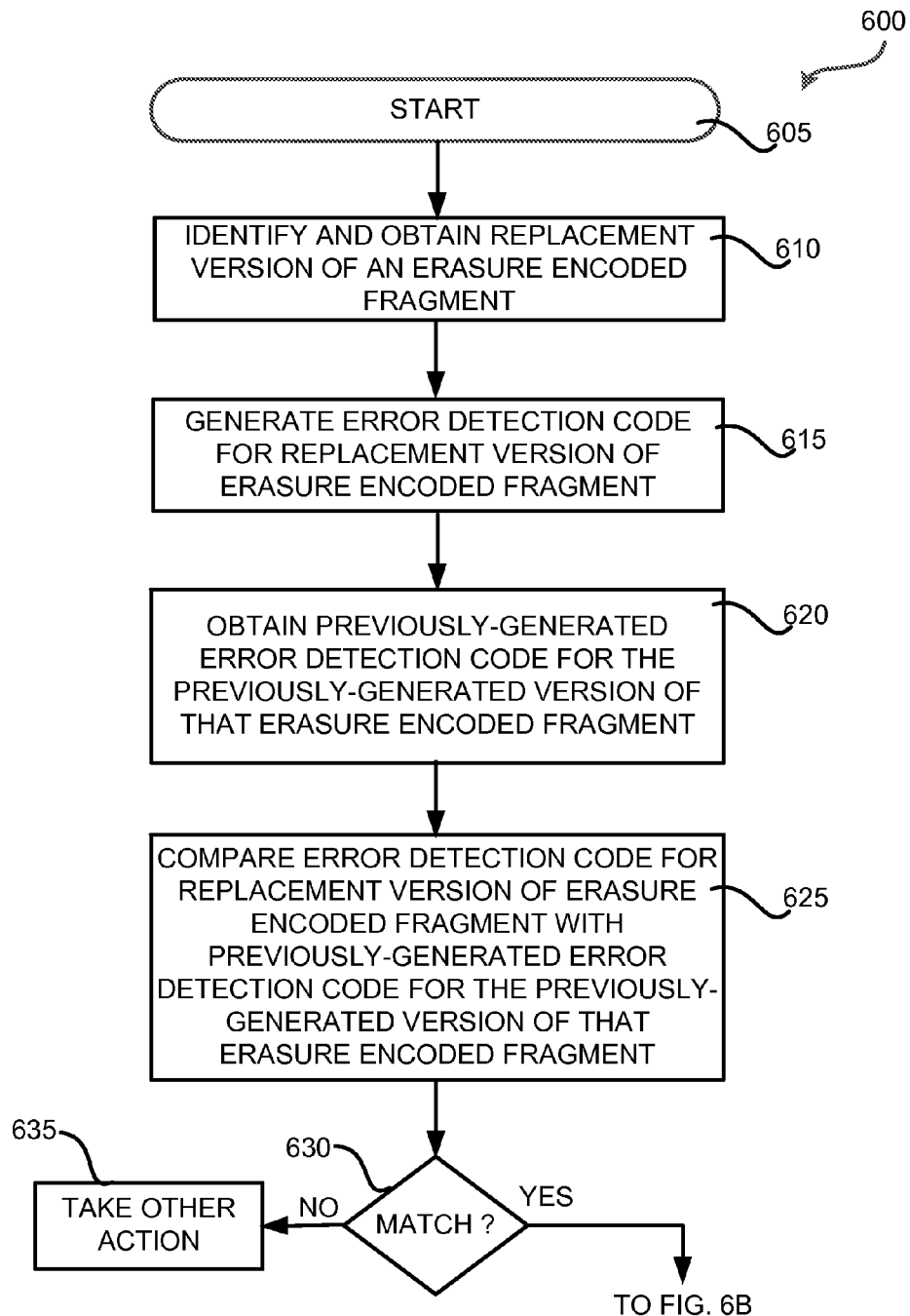
FIGS. 6A and 6B are a flow diagrams showing an illustrative routine for verifying an erasure encoded fragment.
Figure 6B:
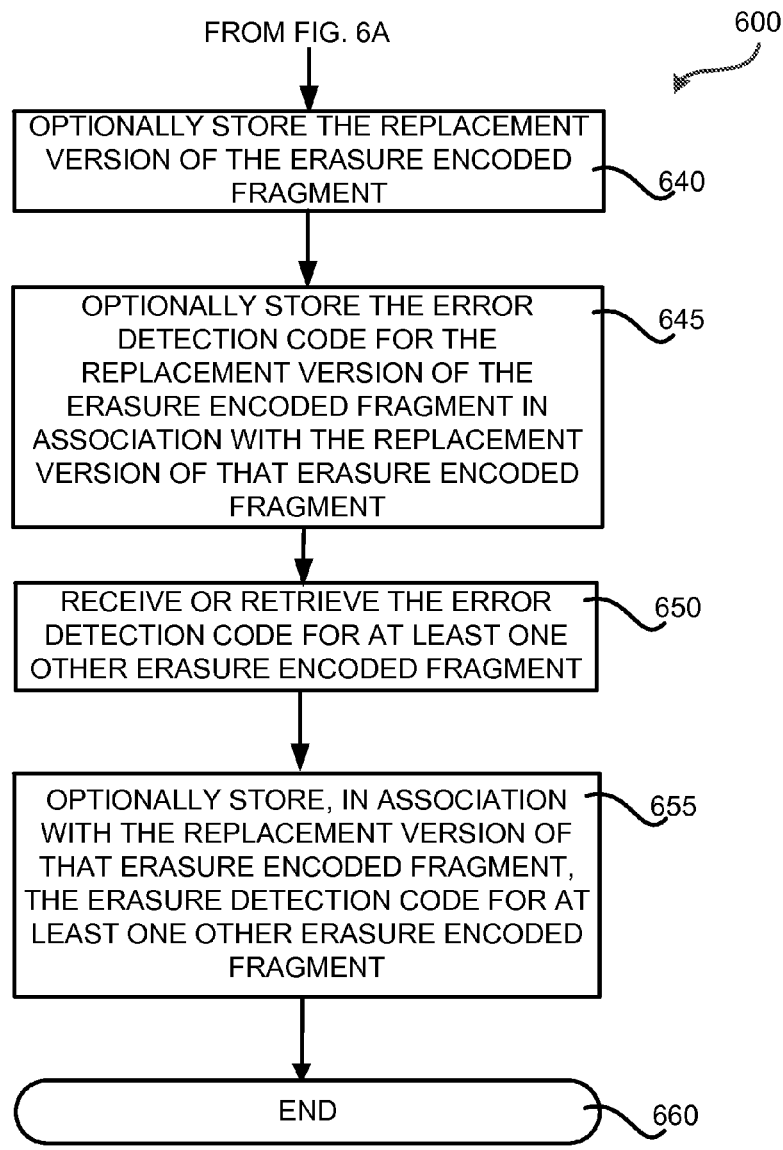

FIGS. 6A and 6B are flow diagrams showing a general illustrative routine 600 performed by a system 100 or component thereof, such as a client access server 20, a server 30A1-30AN in a data center 30A-30N, other computing device, or combination thereof, for verifying the accuracy of an erasure encoded fragment. The routine 600 begins at operation 605. The system 100 then obtains 610 a replacement version of an erasure encoded fragment. The system may obtain the replacement version by generating, receiving, or retrieving the replacement version. The replacement version may have been generated by the system, or by a server on another system, by using the process described above, or by some other process, such as but not limited to, generating the replacement version based on the original data file or a reconstructed data file.

At operation 615 an error detection code is generated for the replacement version of that erasure encoded fragment. At operation 620 the system obtains the previously-generated error detection code for the previously-generated version of that erasure encoded fragment. The system may obtain the previously-generated error detection code, for example, receiving or retrieving the previously-generated error detection code. For example, the previously-generated version of that erasure encoded fragment may be the version originally created from the data file, and the previously-generated error detection code may be the error detection code originally generated for that original version of the erasure encoded fragment.

At operation 625 the error detection code for the replacement version of that erasure encoded fragment is compared with the previously-generated error detection code for the previously-generated version of that erasure encoded fragment. At operation 630, if there is not a match, then other action 635 may be taken. For example, the replacement version may be generated again using a different set of erasure encoded fragments, or the data file may be reconstructed and the replacement version generated using the reconstructed data file, or the error detection for the original erasure encoded fragment may be retrieved from a different one of the original erasure encoded fragments, etc. For example, if a replacement fragment B is generated using fragments A, C and D, and the error detection codes do not match at operation 635, then the replacement fragment B might be generated again by using fragments, A, C and E, or F, G, and H, etc.

As another example, if the previously-generated error detection code for fragment B was stored in association with the previously-generated fragments E, G, and J, and the previously-generated error detection code for fragment B stored in association with fragment E does not match the error detection code for the replacement fragment, then the error detection code for the replacement fragment may be compared with the previously-generated error detection code for fragment B stored in association with fragment G, or fragment J, so as to determine whether the replacement version of the erasure encoded fragment is incorrect or whether a previously-generated error detection code has been corrupted.

If there is a match then, at operation 640, the replacement version of the erasure encoded fragment is preferably, but not necessarily, stored. For example, it may be desirable to generate an erasure encoded fragment and its error detection code and compare that with a previously-generated erasure encoded fragment and/or error detection code to independently verify that the previously-generated had not become undetectably corrupted, such as where multiple errors may corrupt both the erasure encoded fragment and its error detection code in a manner such that they still match. Also, at operation 645, the error detection code for the replacement version of that erasure encoded fragment is preferably, but not necessarily, stored in association with the replacement version of that erasure encoded fragment. Note that if the error detection code for the replacement version of that erasure encoded fragment has the same value as the previously-generated error detection code for the previously-generated version of that erasure encoded fragment, then it does not matter which of these error detection codes (the error detection code for the replacement version of that erasure encoded fragment or the previously-generated error detection code for the previously-generated version of that erasure encoded fragment) is actually stored in association with the replacement version of the erasure encoded fragment. If a replacement erasure encoded fragment has been generated and an error detection code for that particular erasure encoded fragment has not been previously stored in association with other erasure encoded fragments, then that error detection code will preferably be stored in association with at least some of the erasure encoded fragments.

At operation 650, the system receives or retrieves the error detection code for at least one other erasure encoded fragment. Then, at operation 655, the system preferably, but not necessarily, stores, in association with the replacement version of the erasure encoded fragment, the error detection code for the at least one other erasure encoded fragment. As discussed above, multiple error detection codes for multiple erasure encoded fragments may be stored in association with each erasure encoded fragment.

The process then ends at operation 660. Thus, each previously-generated erasure encoded fragment (which includes originally-generated erasure encoded fragments), and each replacement version of an erasure encoded fragment, preferably has stored, in association with it, its own error detection code and the error detection code for at least one other erasure encoded fragment.

It should be appreciated that the logical operations described herein may be implemented (1) as a sequence of computer implemented acts or program modules running on a computing system and/or (2) as interconnected machine logic circuits or circuit modules within the computing system. The implementation of the various components described herein is a matter of choice dependent on the performance and other requirements of the computing system. Accordingly, the logical operations described herein are referred to variously as operations, structural devices, acts, or modules. These operations, structural devices, acts, and modules may be implemented in software, in firmware, in special purpose digital logic, and any combination thereof. It should also be appreciated that more or fewer operations may be performed than shown in the figures and described herein. These operations may also be performed in parallel, or in a different order than those described herein.

Figure 7:
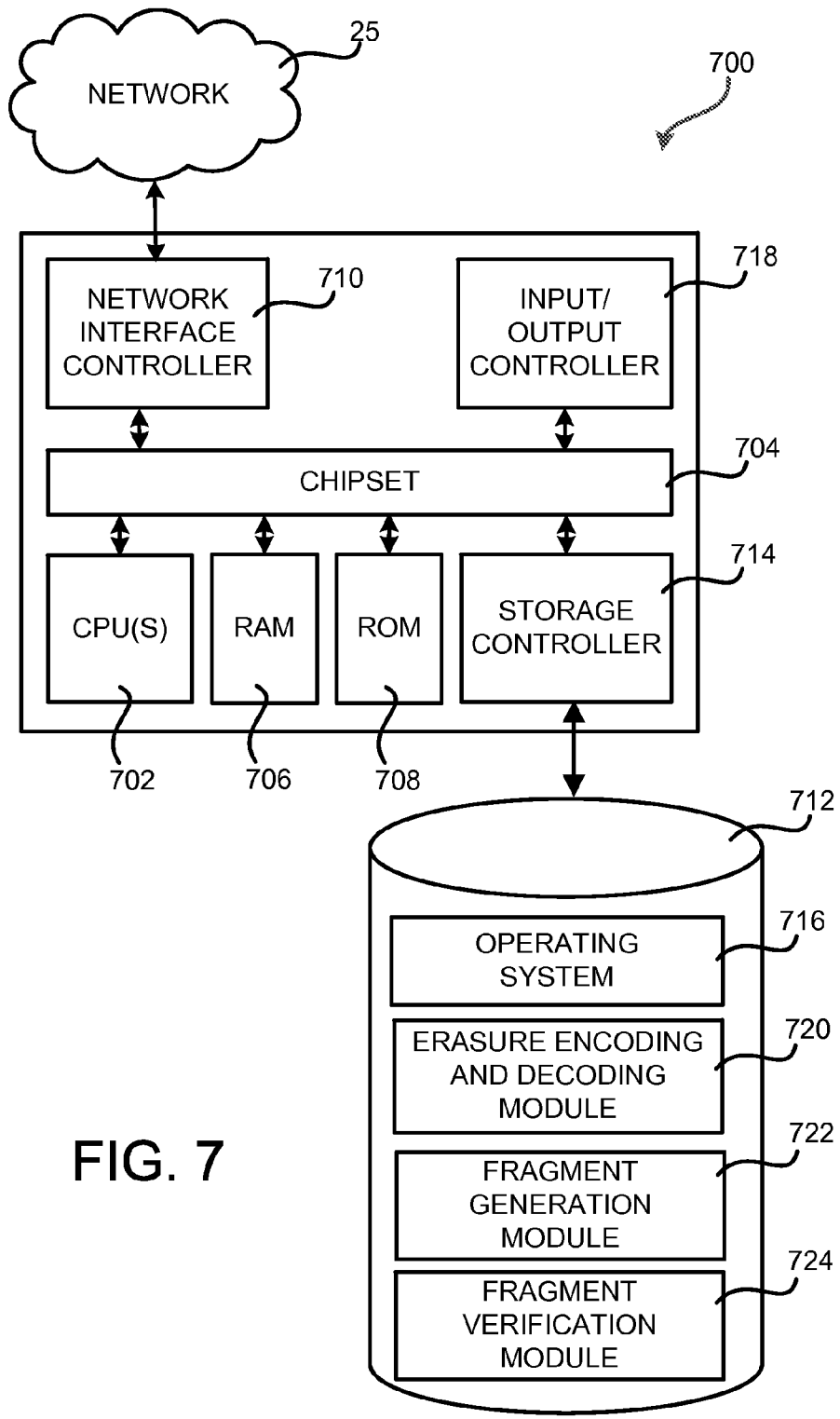
FIG. 7 is a computer architecture diagram showing an exemplary computer architecture for a device capable of performing the functionality disclosed herein for generating and/or verifying a new erasure encoded fragment.

FIG. 7 is a computer architecture diagram showing an exemplary computer architecture for a client access server or other computing device 700 capable of performing the functionality disclosed herein for generating a new erasure encoded fragment and/or verifying the integrity of the newly-generated fragment. The computer architecture shown illustrates a conventional server computer, workstation, desktop computer, laptop, network appliance, or other computing device, and may be utilized to execute any aspects of the software components presented herein described as executing within the computing device and/or other computing devices mentioned herein.

The computer 700 includes a baseboard, or "motherboard," which is a printed circuit board to which a multitude of components or devices may be connected by way of a system bus or other electrical communication paths. In one illustrative configuration, one or more central processing units ("CPUs") 702 operate in conjunction with a chipset 704. The CPUs 702 are standard programmable processors that perform arithmetic and logical operations necessary for the operation of the computer 700.

The CPUs 702 perform the necessary operations by transitioning from one discrete, physical state to the next through the manipulation of switching elements that differentiate between and change these states. Switching elements may generally include electronic circuits that maintain one of two binary states, such as flip-flops and electronic circuits that provide an output state based on the logical combination of the states of one or more other switching elements, such as logic gates. These basic switching elements may be combined to create more complex logic circuits, including registers, adders-subtractors, arithmetic logic units, floating-point units and the like.

The chipset 704 provides an interface between the CPUs 702 and the remainder of the components and devices on the baseboard. The chipset 704 may provide an interface to a random access memory ("RAM") 706, used as the main memory in the computer 700. The chipset 704 may further provide an interface to a computer-readable storage medium such as a read-only memory ("ROM") 708 or non-volatile RAM ("NVRAM") for storing basic routines that help or serve to start up the computer 700 and to transfer information between the various components and devices. The ROM 708 or NVRAM may also store other software components necessary for the operation of the computer 700 in accordance with the configurations described herein.

The computer 700 may operate in a networked environment using logical connections to remote computing devices and computer systems through the network 25. The chipset 704 may include functionality for providing network connectivity through a network interface controller ("NIC") 710, such as a gigabit Ethernet adapter. The NIC 710 is capable of connecting the computer 700 to other computing devices over the network. It should be appreciated that multiple NICs 710 may be present in the computer 700, connecting the computer to multiple communication channels, such as but not limited to communication channels in the network, other types of networks, and remote computer systems.

The computer 700 may be connected to a mass storage device 712 that provides non-volatile storage for the computer. The mass storage device 712 may store system programs, application programs, other program modules and data, which have been described in greater detail herein. The mass storage device 712 may be connected to the computer 700 through a storage controller 714 connected to the chipset 704. The mass storage device 712 may consist of one or more physical storage units. The storage controller 714 may interface with the physical storage units through a serial attached SCSI ("SAS") interface, a serial advanced technology attachment ("SATA") interface, a fiber channel ("FC") interface, or other type of interface for physically connecting and transferring data between computers and physical storage units.

The computer 700 may store data on the mass storage device 712 by transforming the physical state of the physical storage units to reflect the information being stored. The specific transformation of physical state may depend on various factors, in different implementations of this description. Examples of such factors may include, but are not limited to, the technology used to implement the physical storage units, whether the mass storage device 712 is characterized as primary or secondary storage and the like.

For example, the computer 700 may store information to the mass storage device 712 by issuing instructions through the storage controller 714 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computer 700 may further read information from the mass storage device 712 by detecting the physical states or characteristics of one or more particular locations within the physical storage units.

In addition to the mass storage device 712 described above, the computer 700 may have access to other computer-readable storage medium to store and retrieve information, such as program modules, data structures, or other data. It should be appreciated by those skilled in the art that computer-readable storage media can be any available media that provides for the storage of data and that may be accessed by the computer 700.

Notwithstanding anything to the contrary herein, the terms computer-readable storage medium and computer-readable storage media, as used herein, comprise only statutory subject matter within the meaning of 35 U.S.C. §101 as interpreted or defined by a court of competent jurisdiction. These terms do not, however, encompass propagated signals per se nor any other interpretation which renders a claim invalid under 35 U.S.C. §101.

By way of example, and not limitation, computer-readable storage media may include volatile and non-volatile, removable and non-removable media implemented in any method or technology. Computer-readable storage media includes, but is not limited to, random access memory (RAM), read only memory (ROM), erasable programmable ROM ("EPROM"), electrically-erasable programmable ROM ("EEPROM"), flash memory or other solid-state memory technology, compact disc ROM ("CD-ROM"), digital versatile disk ("DVD"), high definition DVD ("HD-DVD"), BLU-RAY, or other optical storage, magnetic cassettes, magnetic tape, magnetic disk storage or other magnetic storage devices, or any other medium that can be used to store the desired information in a non-transitory fashion.

The mass storage device 712 may store an operating system 716 utilized to control the operation of the computer 700. According to one configuration, the operating system includes a member of the LINUX family of operating systems. According to another configuration, the operating system includes a member of the WINDOWS® SERVER family of operating systems from MICROSOFT Corporation in Redmond, Wash. According to further configurations, the operating system may include a member of the UNIX family of operating systems. It should be appreciated that other operating systems may also be utilized.

The mass storage device 712 may store other system or application programs, modules, and/or data utilized by the computer 700 such as an erasure encoding and decoding module 720, a fragment generation module 722, and a fragment verification module 724. The erasure encoding and decoding module 720 contains instructions for erasure encoding a data file to produce erasure encoded fragments, and for decoding erasure encoded fragments to reconstruct the data file. The erasure encoding and decoding module 720 also contains information about which erasure encoding scheme is to be used, and the steps required to execute that scheme. The fragment generation module 722 contains instructions for generating fragments as disclosed herein. The fragment verification module 724 contains instructions for performing the operations disclosed herein to verify the integrity of a newly-generated fragment.

In one configuration, the mass storage device 712 or other computer-readable storage media is encoded with computer-executable instructions that, when loaded into the computer 700, transform the computer from a general-purpose computing system into a special-purpose computer capable of implementing the configurations described herein. These computer-executable instructions transform the computer 700 by specifying how the CPUs 702 transition between states, as described above. According to one configuration, the computer 700 has access to computer-readable storage media storing computer-executable instructions which, when executed by the computer 700, perform aspects of one or more of the methods or procedures described herein.

The computer 700 may also include an input/output controller 718 for receiving and processing input from a number of input devices, such as a keyboard, a mouse, a touchpad, a touch screen, an electronic stylus, or other type of input device. Similarly, the input/output controller 718 may provide output to a display, such as a computer monitor, a flat-panel display, a digital projector, a printer, a plotter, or other type of output device. It will be appreciated that the computer 700 may not include all of the components shown herein, may include other components that are not explicitly shown herein, or may utilize an architecture completely different than that shown herein.

Although the exemplary computer architecture shown and discussed herein is directed to the client access server 20, this general architecture is also suited for the storage servers 30 and the client computer 10, the primary difference being the use of different modules or programs in the mass storage device 712 so as to provide for implementation of the different functions performed by the particular device.

Although the operation and implementation have been described herein in terms of logical operations for convenience of illustration and discussion, other forms of operation and implementation may be used, such as but not limited to program modules which cause execution of the operations. Based on the foregoing, it should be appreciated that technologies for newly-generating an erasure encoded fragment, and for verifying the integrity of the newly-generated erasure encoded fragment, have been disclosed herein and that it may be possible to perform such generation and/or verification using variations of the processes described herein. Although the subject matter presented herein has been described in language specific to systems, methodological acts, and processes, it is to be understood that the concepts disclosed herein are not necessarily limited to the specific features, acts, or media described herein. Rather, the specific features, acts and mediums are disclosed as example forms.

The subject matter described herein is provided by way of illustration for the purposes of teaching, suggesting, and describing, and not limiting or restricting. Combinations and alternatives to the illustrated configurations are contemplated, described herein, and set forth in the claims. Various modifications and changes may be made to the subject matter described herein without strictly following the configurations and applications illustrated and described, and without departing from the scope of the following claims.

What is claimed is:

1. A computer-implemented method for generating and verifying an identified erasure encoded fragment, the method being performed by at least one computer, the method comprising:
  generating a plurality of erasure encoded fragments based at least in part on an erasure encoding scheme and a data file, the plurality of erasure encoded fragments including at least a first erasure encoded fragment and a second erasure encoded fragment;
  storing the first erasure encoded fragment and the second erasure encoded fragment;
  generating an error detection code for the first erasure encoded fragment;
  storing the error detection code for the first erasure encoded fragment in association with the first erasure encoded fragment and the second erasure encoded fragment;
  generating a replacement erasure encoded fragment for the first erasure encoded fragment;
  generating a new error detection code for the replacement erasure encoded fragment;

obtaining the error detection code for the first erasure encoded fragment using the association between the error detection code and the second erasure encoded fragment; and verifying the replacement erasure encoded fragment by comparing the error detection code for the first erasure encoded fragment and the new error detection code for the replacement erasure encoded fragment.

2. The computer-implemented method of claim 1, further comprising:

determining that the error detection code for the first erasure encoded fragment matches the new error detection code for the replacement erasure encoded fragment; and based at least in part on the error detection code matching the replacement error detection code, storing the replacement erasure encoded fragment.

3. The computer-implemented method of claim 1, wherein obtaining the error detection code comprises:

identifying the second erasure encoded fragment that is associated with the error detection code; and retrieving the error detection code from a location associated with the second erasure encoded fragment.

4. The computer-implemented method of claim 1, further comprising at least one of:

based at least in part on the first erasure encoded fragment including an even-numbered erasure encoded fragment, further storing the error detection code in association with a plurality of odd-numbered erasure encoded fragments;

based at least in part on the first erasure encoded fragment including an odd-numbered erasure encoded fragment, further storing the error detection code in association with a plurality of even-numbered erasure encoded fragments;

based at least in part on the first erasure encoded fragment including an even-numbered erasure encoded fragment, further storing the error detection code in association with a plurality of other even-numbered erasure encoded fragments;

based at least in part on the first erasure encoded fragment including an odd-numbered erasure encoded fragment, further storing the error detection code in association with a plurality of other odd-numbered erasure encoded fragments; or generating a plurality of sets of erasure encoded fragment groups, a first group containing a plurality of erasure encoded fragments including the first erasure encoded fragment, the first group differing from a second group by at least one erasure encoded fragment, and storing the error detection code in association with the first group and the second group.

5. The computer-implemented method of claim 1, wherein the error detection code is a checksum.

6. The computer-implemented method of claim 1, wherein generating the replacement erasure encoded fragment comprises generating the replacement erasure encoded fragment from at least one stored erasure encoded fragment.

7. The computer-implemented method of claim 1, further comprising generating a reconstructed data file from at least one stored erasure encoded fragment, and wherein generating the replacement erasure encoded fragment comprises generating the replacement erasure encoded fragment from the reconstructed data file.

8. The computer-implemented method of claim 1, wherein:

generating the replacement erasure encoded fragment comprises generating the replacement erasure encoded fragment from a first set of stored erasure encoded fragments, and based at least in part on the error detection code for the first erasure encoded fragment not matching the new error detection code for the replacement erasure encoded fragment, the method further comprises:

generating another replacement erasure encoded fragment for the first erasure encoded fragment from a second, different set of stored erasure encoded fragments;

generating another new error detection code for the another replacement erasure encoded fragment;

comparing the another new error detection code with the error detection code; and based at least in part on the another new error detection code matching the error detection code, storing the another replacement erasure encoded fragment.

9. The computer-implemented method of claim 1, further comprising:

obtaining a second error detection code for the second erasure encoded fragment;

storing the replacement erasure encoded fragment; and storing the second error detection code in association with the replacement erasure encoded fragment.

10. The computer-implemented method of claim 1, further comprising at least one of:

based at least in part on the replacement erasure encoded fragment including an even-numbered fragment, obtaining a stored error detection code for an odd-numbered erasure encoded fragment and storing the stored error detection code for the odd-numbered erasure encoded fragment in association with the replacement erasure encoded fragment; and based at least in part on the replacement erasure encoded fragment including an odd-numbered fragment obtaining a stored error detection code for an even-numbered erasure encoded fragment and storing the stored error detection code for the even-numbered erasure encoded fragment in association with the replacement erasure encoded fragment.

11. A system to generate and verify an identified erasure encoded fragment, the system comprising:

one or more processors; and one or more non-transitory computer-readable media storing instructions that, when executed by the one or more processors, cause the one or more processors to perform operations comprising:

generating a plurality of erasure encoded fragments based at least in part on an erasure encoding scheme and a data file, the plurality of erasure encoded fragments including at least a first erasure encoded fragment and a second erasure encoded fragment;

storing the first erasure encoded fragment and the second erasure encoded fragment;

generating an error detection code for the first erasure encoded fragment;

storing the error detection code for the first erasure encoded fragment in association with the first erasure encoded fragment and the second erasure encoded fragment;

generating a replacement erasure encoded fragment for the first erasure encoded fragment;

generating a new error detection code for the replacement erasure encoded fragment;

obtaining the error detection code for the first erasure encoded fragment using the association between the error detection code and the second erasure encoded fragment; and verifying the replacement erasure encoded fragment by comparing the error detection code for the first erasure encoded fragment and the new error detection code for the replacement erasure encoded fragment.

12. The system of claim 11, the operations further comprising storing the replacement erasure encoded fragment based at least in part on the error detection code for the first erasure encoded fragment matching the new error detection code for the replacement erasure encoded fragment.

13. The system of claim 11, the operations further comprising performing at least one of:

based at least in part on the first erasure encoded fragment including an even-numbered erasure encoded fragment, further storing the error detection code in association with a plurality of odd-numbered erasure encoded fragments;

based at least in part on the first erasure encoded fragment including an odd-numbered erasure encoded fragment, further storing the error detection code in association with a plurality of even-numbered erasure encoded fragments;

based at least in part on the first erasure encoded fragment including an even-numbered erasure encoded fragment, further storing the error detection code in association with a plurality of other even-numbered erasure encoded fragments;

based at least in part on the first erasure encoded fragment including an odd-numbered erasure encoded fragment, then store that further storing the error detection code in association with a plurality of other odd-numbered erasure encoded fragments; or generating a plurality of sets of erasure encoded fragment groups, a first group containing a plurality of erasure encoded fragments including the first erasure encoded fragment, the first group differing from a second group by a least one erasure encoded fragment, and storing the error detection code in association with the first group and the second group.

14. The system of claim 11, the operations further comprising generating a checksum for the error detection code.

15. The system of claim 11, the operations further comprising generating the replacement erasure encoded fragment from at least one stored erasure encoded fragment.

16. The system of claim 11, the operations further comprising generating a reconstructed data file from at least one stored erasure encoded fragment, and wherein generating the replacement erasure encoded fragment comprises generating the replacement erasure encoded fragment from the reconstructed data file.

17. The system of claim 11, wherein:

the replacement encoded fragment is generated from a first set of stored erasure encoded fragments, and based at least in part on the error detection code for the first erasure encoded fragment not matching the new error detection code for the replacement erasure encoded fragment, the operations further comprising:

generating another replacement erasure encoded fragment for the first erasure encoded fragment from a second, different set of stored erasure encoded fragments;

generating another new error detection code for the another replacement erasure encoded fragment;

comparing the another new error detection code of the another replacement erasure encoded fragment with the error detection code of the first erasure encoded fragment; and based at least in part on the another new error detection code matching the error detection code, storing the another replacement erasure encoded fragment.

18. The system of claim 11, the operations further comprising:

obtaining a second error detection code for the second erasure encoded fragment;

storing the replacement erasure encoded fragment; and storing the second error detection code in association with the replacement erasure encoded fragment.

19. The system of claim 11, the operations further comprising at least one of:

obtaining a first stored error detection code for an odd-numbered erasure encoded fragment and store the first stored error detection code in association with the replacement erasure encoded fragment based at least in part on the replacement erasure encoded fragment including an even-numbered fragment; and obtaining a second stored error detection code for an even-numbered erasure encoded fragment and store the second stored error detection code in association with the replacement erasure encoded fragment based at least in part on the replacement erasure encoded fragment including an odd-numbered fragment.

20. One or more computer-readable media storing computer-executable instructions that, when executed by the one or more processors, cause the one or more processors to perform operations comprising:

generating, based at least in part on a data file, at least a first erasure encoded fragment and a second erasure encoded fragment;

storing the first erasure encoded fragment and the second erasure encoded fragment;

generating an error detection code based at least in part on the first erasure encoded fragment;

storing the error detection code in association with the first erasure encoded fragment and the second erasure encoded fragment;

obtaining a replacement version of the first erasure encoded fragment;

generating a new error detection code based at least in part on the replacement version of the first erasure encoded fragment;

obtaining the error detection code having been stored in association with the second erasure encoded fragment; and verifying the replacement version of the first erasure encoded fragment using the error detection code and the new error detection code.

\* \* \* \* \*

UNITED STATES PATENT AND TRADEMARK OFFICE
CERTIFICATE OF CORRECTION

PATENT NO. : 9,489,254 B1  
APPLICATION NO. : 14/500576  
DATED : November 8, 2016  
INVENTOR(S) : Franklin et al.

Page 1 of 1

It is certified that error appears in the above-identified patent and that said Letters Patent is hereby corrected as shown below:

On the Title Page

Item (72), change "Jonathan Robert Collins, II" to --Jonathan Robert Collins--.

Signed and Sealed this  
Seventeenth Day of April, 2018

Andrei Iancu  
*Director of the United States Patent and Trademark Office*